United States Patent
Gabl

(10) Patent No.: US 10,668,482 B2
(45) Date of Patent: Jun. 2, 2020

(54) METHOD FOR PROCESSING OF ELECTRICAL AND ELECTRONIC COMPONENTS TO RECOVER VALUABLE MATERIALS

(71) Applicant: Andritz AG, Graz (AT)

(72) Inventor: Helmuth Gabl, Graz (AT)

(73) Assignee: Andritz AG, Graz (AT)

( * ) Notice: Subject to any disclaimer, the term of this patent is extended or adjusted under 35 U.S.C. 154(b) by 362 days.

(21) Appl. No.: 15/528,619

(22) PCT Filed: Nov. 19, 2015

(86) PCT No.: PCT/EP2015/077083
§ 371 (c)(1),
(2) Date: May 22, 2017

(87) PCT Pub. No.: WO2016/087220
PCT Pub. Date: Jun. 9, 2016

(65) Prior Publication Data
US 2017/0259276 A1  Sep. 14, 2017

(30) Foreign Application Priority Data
Dec. 4, 2014  (AT) .............................. A 50883/2014

(51) Int. Cl.
*B03B 9/00* (2006.01)
*B03B 9/06* (2006.01)
(Continued)

(52) U.S. Cl.
CPC ............... *B03B 9/061* (2013.01); *B02C 7/02* (2013.01); *B02C 7/11* (2013.01); *B02C 7/14* (2013.01); *B02C 7/186* (2013.01); *B02C 19/186* (2013.01); *B02C 23/02* (2013.01); *B02C 23/10* (2013.01); *B02C 23/36* (2013.01); *B03B 5/04* (2013.01); *B03C 1/30* (2013.01); *D21D 1/30* (2013.01); *D21D 1/303* (2013.01); *D21D 1/306* (2013.01); *H05K 3/00* (2013.01); *B03C 2201/20* (2013.01); *H05K 2203/178* (2013.01);
(Continued)

(58) Field of Classification Search
CPC .. B02C 7/02; B02C 7/14; B02C 7/186; B02C 23/36; B02C 23/10; B03B 9/061; D21D 1/30; D21D 1/303; D21D 1/306
USPC ............................... 241/21, 29, 261.2, 261.3
See application file for complete search history.

(56) References Cited

U.S. PATENT DOCUMENTS 5,683,040 A * 11/1997 Jakob .................... B02C 19/186
241/14
6,523,764 B2 * 2/2003 Ueno ........................ B09B 3/00
241/24.13
(Continued)

FOREIGN PATENT DOCUMENTS

DE         4100346 A1    7/1992
DE        19518277 C1    5/1996
WO    WO2011124195 A2   10/2011

*Primary Examiner* — Faye Francis
(74) *Attorney, Agent, or Firm* — Alix, Yale & Ristas, LLP

(57) ABSTRACT

The subject of the present invention is a method for processing electrical and electronic components in order to recover valuable materials, such as the metals contained in printed circuit boards. According to this method, the electrical and electronic components are pre-shredded mechanically and then mixed with a liquid before they undergo wet milling (5).

14 Claims, 2 Drawing Sheets

Figure 1:
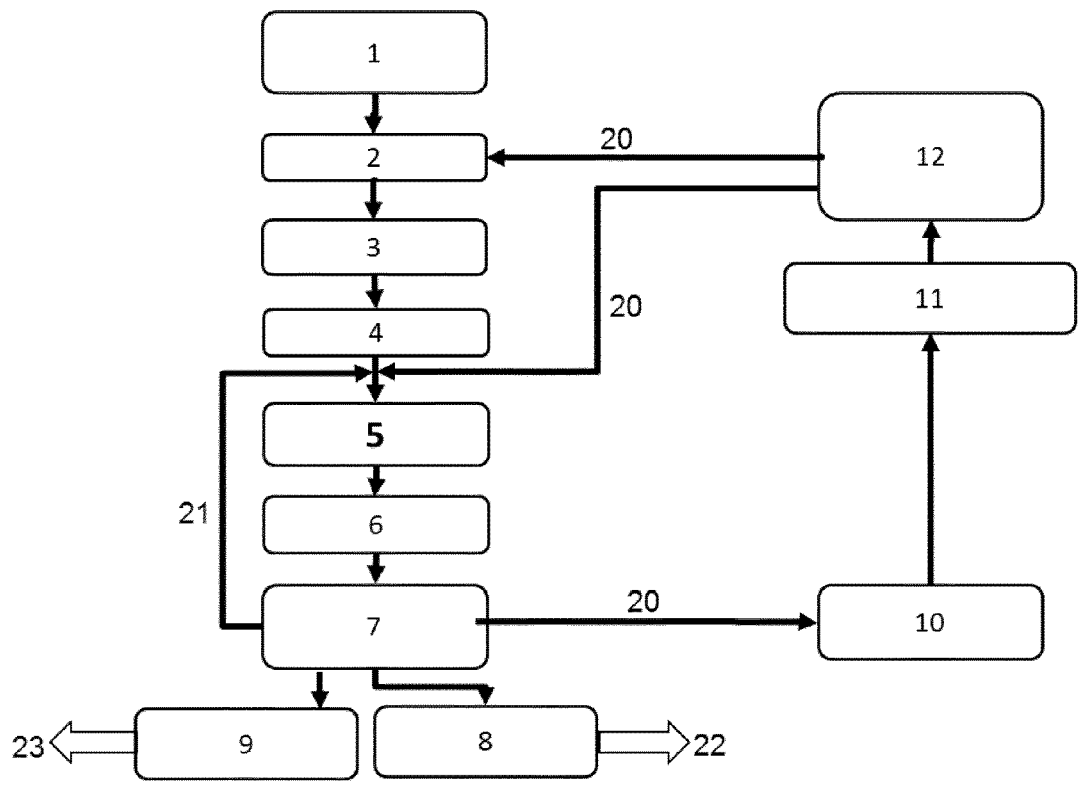

(51) Int. Cl.
*B02C 7/14* (2006.01)
*B02C 7/18* (2006.01)
*B02C 23/36* (2006.01)
*B02C 19/18* (2006.01)
*D21D 1/30* (2006.01)
*B02C 7/11* (2006.01)
*B02C 7/02* (2006.01)
*B02C 23/02* (2006.01)
*B02C 23/10* (2006.01)
*B03B 5/04* (2006.01)
*B03C 1/30* (2006.01)
*H05K 3/00* (2006.01)

(52) U.S. Cl.
CPC ........... *Y02W 30/521* (2015.05); *Y02W 30/82* (2015.05); *Y02W 30/822* (2015.05)

(56) References Cited

U.S. PATENT DOCUMENTS

| | | | | |
|---|---|---|---|---|
| 6,766,970 B2* | 7/2004 | Pecora | .................... | B02C 13/06 |
| | | | | 241/152.2 |
| 6,986,192 B2* | 1/2006 | Fitch | ....................... | B03B 9/061 |
| | | | | 204/155 |
| 8,979,006 B2* | 3/2015 | Pudas | ..................... | H01M 6/52 |
| | | | | 241/24.14 |

* cited by examiner

METHOD FOR PROCESSING OF ELECTRICAL AND ELECTRONIC COMPONENTS TO RECOVER VALUABLE MATERIALS

The subject of the present invention is a method for processing electrical and electronic components in order to recover valuable materials, such as the metals contained in printed circuit boards. The electrical and electronic components are pre-shredded mechanically according to this method.

Electronic devices have one or more printed circuit boards for control purposes. A wide variety of different functional units are mounted on these printed circuit boards. These units are usually connected electrically to copper loops or other high-quality metals that conduct electricity. In order to make these control units as stable as possible, both mechanically and thermally, the connecting wires are usually placed on a bed of FRP (FRP=fiber-reinforced plastic) and either connected or melted in place by means of resins. The resins used are often phenol resins and different types of epoxy resin compounds. This embedding provides protection against moisture as well. In addition to providing mechanical protection due to the very low coefficients of thermal expansion, the FRP panel also enables thermal stability. Glass mats or paper laminates can also be used in addition to FRP. In some cases, Teflon, ceramic, and other polymers are also used in the manufacture of circuit boards.

Many of the electronic devices are no longer suitable for use after only a relatively short period and are scrapped. The scrap produced here contains a large number of valuable raw materials that are worth recovering. These valuable materials are metals, e.g. copper, iron, tin, lead, gold, silver, and platinum. However non-metallic materials, such as glass fibers, are also worth recovering.

Processing of electrical and electronic scrap is necessary not only to conserve resources, but more so because the electronic components in the devices contain a number of materials, for example heavy metals, with risk potential if sent to landfill. This scrap also includes flame-retardant residual materials that contain halogen. If these materials undergo thermal treatment (incineration), there is a risk of dioxins and furans forming.

Less sophisticated electrical equipment also contains valuable materials, e.g. copper and iron or even plastic, that are worth recovering.

There are already many different methods of processing scrap from electrical and electronic components. All of these methods try to recover residual materials such as FRP in a fraction containing very little metal and metal in a fraction free of residual materials; mechanical processes are used in particular for this purpose.

For example, DE 41 00 346 A1 describes a method for mechanical treatment of unsorted equipment scrap where the electrical and electronic components are disassembled manually first of all and then shredded mechanically in several stages, and where special sorting steps are included between the shredding stages.

Shredding is performed here with the aid of cutting mills. In similar processes, twin-shaft cutters, hammer mills or shredders are used for this purpose. In all these shredding methods, a considerable amount of dust is formed so shredding devices of this kind need explosion protection. The dust generated usually has to be disposed of as hazardous waste because of the pollutant content.

Furthermore, the shredding and milling process can generate heat that causes plastic and resin content to melt. This means that the valuable materials are bonded more intensively with the residual materials. DE 195 18 277 C1 describes a method for processing printed circuit board scrap from electrical and electronic equipment in which the circuit boards are pre-shredded mechanically and then embrittled cryogenically with liquid nitrogen and shredded in a hammer mill. This method also generates a considerable amount of dust.

Separation of metals from residual materials is often unsatisfactory with conventional shredding methods because of the intensive bond between the metals and the residual materials, particularly on circuit boards.

DE 195 18 277 C1 discloses a method for processing old printed circuit boards, where the printed circuit boards are pre-shredded and then embrittled cryogenically with liquid nitrogen and shredded in a hammer mill. WO 2011/124195 A2 discloses a method for processing of printed circuit board scrap where the components are pre-shredded if necessary and then undergo extraction followed by shock wave treatment using shock waves triggered by high voltage in a fluid dielectric medium.

The invention is thus based on the objective of providing a method of processing electrical and electronic components that provides good separation of valuable and residual materials without generating a lot of dust.

This object is accomplished by means of a method according to claim 1.

According to the invention, the pre-shredded components are mixed with a liquid, preferably water, and then undergo wet milling. Wet milling in this context means a milling process in the presence of a liquid. The liquid or water can also be added here directly in the milling unit. The milling material can thus be fed to the milling unit in a wet or dry state, but should be wet when it comes into contact with the milling set at the latest so that the plastic content does not melt.

As a result of wet milling and due to the cooling effect of the water, the plastic fraction and epoxy resins do not melt. In addition, there is no need for explosion protection because the process is dust-free and takes place in a wet medium.

According to the invention, wet milling is performed between milling segments moving in relation to one another, for example between two milling discs, at least one of which is rotating (rotor-stator principle).

The milling discs can have milling teeth arranged concentrically.

Tests performed with the method according to the invention have shown that the fractions thus formed can be sorted well because the milled particles have a more uniform size distribution. There are hardly any fines formed.

On circuit boards, the individual fibers in the FRP structure are exposed with almost no damage, unlike in dry disintegration, and the copper content is produced in spherical form because wet milling forms the metal components into a ball shape. This spherical structure of the metal components makes the valuable materials easier to separate, for example on the wet separation table.

The liquid used for wet milling can be recycled within the process and used again for wet milling if necessary after appropriate cooling and removal of fines.

The electrical and electronic components are pre-shredded to a size smaller than 50 mm, preferably smaller than 20 mm. This pre-shredding process can be performed with a cross-flow shredder or a cutting mill, for example. As these units are only used for rough pre-shredding and not for fine shredding, there is very little dust generated here as well.

Dust generated during pre-shredding can also be bound together by spraying with water.

However, the milling elements or segments can also be conical or cylindrical. Both milling elements can rotate here or one milling element can be stationary. It is only the relative movement of the milling elements to one another that is important because the disintegrating action is based on frictional forces being applied.

It is favorable if the milling gap between the two discs is less than 1 mm, preferably less than 0.1 mm. In this way, the copper layers can be detached well from the fibrous FRP, especially on circuit boards, and the detached copper is shaped into balls.

The pre-shredded components are fed preferably to the wet milling unit in the center of the milling discs with the aid of a screw conveyor or a carrier fluid, such as water. The material flow to be milled then flows outwards in a spiral shape.

After wet milling, the valuable materials—primarily the metals—are removed with the aid of a wet separation table, for example, where the metals are separated from the residual materials, such as plastic, FRP fibers, and resins, on the basis of their density, trajectory, surface properties, and frictional adherence.

A wet separation table is a unit applying a wet mechanical process for density separation of fine and finest fractions. The milling material is fed in on a moving, tilted plate. A water cross-flow transports the particles with the lightest specific weight—the light fraction from the separation table—in a film flow in cross direction to the plate. The particles with a higher specific weight are transported along the length of the table as a result of the fast reversing movement by the moving plate and the contact with the plate surface and can then be removed as a heavy fraction. It is also possible to sort into several fractions with a wet separation table. Here, the water used in wet milling can be used as carrier material for the wet separation process.

A heavy media separation or a flotation process can also be used to separate the milled material, with adjustable carrier medium density in each case.

The mix can also be separated into its material components—metals and residual materials—by electrostatic separation. Separation by means of air classification is also conceivable, or a combination of the above mentioned separation methods can be used to remove the valuable materials.

It is useful if iron components are removed with magnets after pre-shredding and before wet milling.

In the following, some embodiments of the invention are described on the basis of FIGS. 1 to 4. The same reference figures in the respective figures refer to the same components or material flows in each case.

FIG. 1 shows a simple process diagram of the processing method according to the invention. The electrical and electronic components are taken from a store 1 and pre-shredded, for example to a size smaller than 50 mm, in a pre-shredding stage. The pre-shredding unit 2 may be, for example, a cutting mill. In order to prevent dust from being generated, water 20 is added here in the form of a fine spray that binds together the dust particles generated during shredding. After the pre-shredding stage 2, iron particles are removed in a magnetic separator 3 and the material flow is screened 4 in order to remove parts that are too large or too small. The pre-shredded electrical and electronic components are then fed to the wet milling stage 5 and milled there between two milling discs. The material flow is transported to the milling unit via the water feed 20. After the wet milling stage 5, the material is screened 6 once again and then undergoes wet separation 7 on a wet separation table, where the valuable materials 22 and the residual materials 23 are separated from one another and then dried in a dryer 8 and 9, respectively.

The mixed fraction 21 from wet separation 7 is fed back to the wet milling stage 5. The water 20 from wet separation 7 is fed to a cleaning stage 11 after the fines have been removed 10 and then to a water tank 12. The water tank 12 supplies the necessary liquid 20 to the pre-shredding 2 and wet milling 5 stages.

Figure 2:
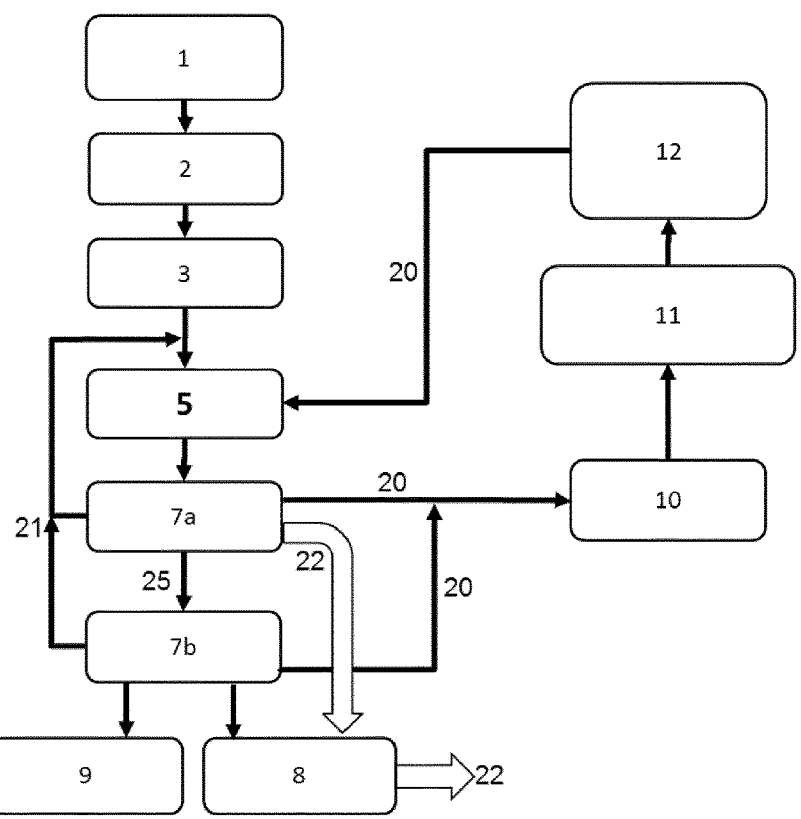

In FIG. 2, the residual materials and the valuable materials are separated in two wet separation stages 7a and 7b. The valuable materials 22 removed in the first wet separation stage 7a are fed directly to the dryer 8, a mixed fraction 21 containing both valuable materials and residual materials is fed to the wet milling stage 5 again, and a flow of residual materials 25, which also contains valuable materials, is fed to the second wet separation table 7b. Here, the remaining valuable materials 22 are separated from the residual materials 23, and a mixed fraction 21 containing valuable materials and residual materials that have not been separated adequately is fed to the milling stage 5 again. The water 20 from the two wet separation stages 7a and 7b is treated as described in FIG. 1.

Figure 3:
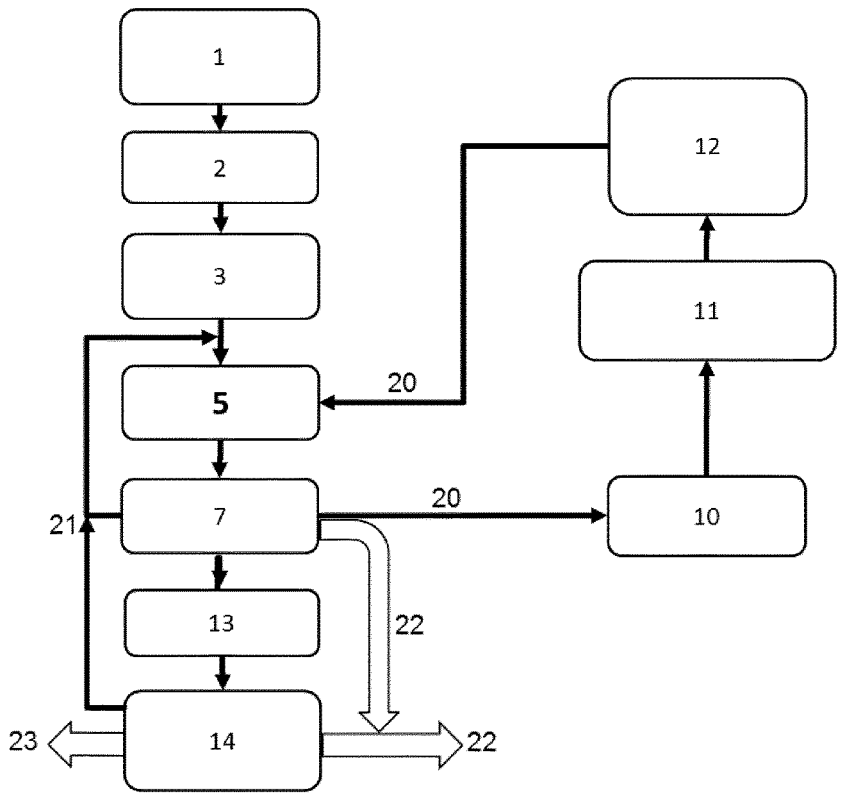

In FIG. 3, the valuable materials 22 and the residual materials 23 are separated with the aid of a wet separation process 7 and a dry separation stage 14, for example an air classifier. Before the dry separation stage 14, the mix is fed to a drying stage 13. Material 21 that has not been separated adequately is taken from the wet separation stage 7 and the dry separation stage 14 and returned to the wet milling stage 5. Valuable materials 22 already recovered in the wet separation stage 7 need not be fed to the dry separation stage 14 as well.

Figure 4:
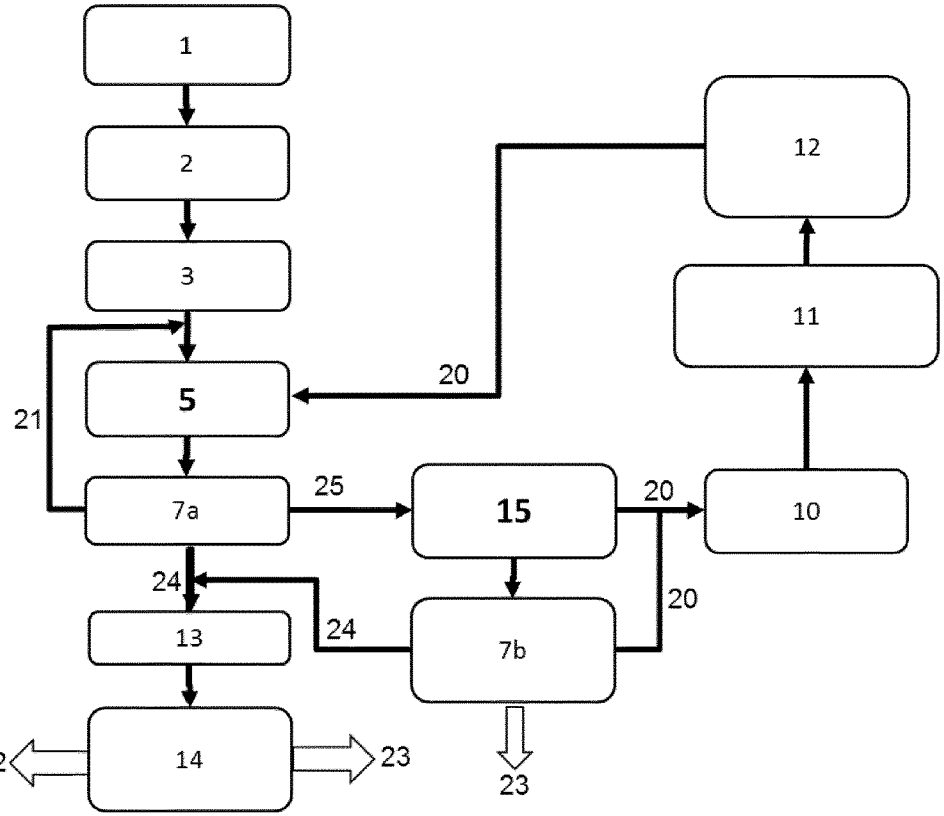

In FIG. 4, the pre-shredded components are milled in a first wet milling stage 5 and fed to a first wet separation stage 7a. A fraction enriched with valuable materials 24 is fed to a drying stage 13 and then to a dry separation stage 14. The mixed fraction 21 from the first wet separation stage 7a is returned to the first wet milling stage 5 again. The fraction 25 enriched with residual materials is milled once again in a second wet milling stage 15 and separated into a fraction enriched with valuable materials 24 and a residual materials flow 23 in a second wet separation stage 7b. The fraction enriched with valuable materials 24 is fed to the drying stage 13 and to the dry separation stage 14.

The invention claimed is:

1. A method for processing electrical and electronic components in order to recover valuable materials including metals (22), comprising:
   providing electrical and electronic components;
   pre-shredding the electrical and electronic components mechanically to provide pre-shredded components;
   mixing the pre-shredded components with a liquid (20) to provide a mixture of pre-shredded components and liquid;
   providing two milling discs that are movable relative to one another; and
   wet milling (5) the mixture of pre-shredded components and liquid between the two milling discs with at least one of the milling discs rotating.

2. The method according to claim 1, wherein the components are pre-shredded to a size smaller than 50 mm.

3. The method according to claim 1, wherein the milling discs have milling teeth arranged concentrically.

4. The method according to claim 1, wherein a milling gap is present between the two milling discs and the milling gap is smaller than 1 mm.

5. The method according to claim 4, wherein the milling gap between the two discs is smaller than 0.1 mm.

6. The method according to claim 1, wherein the mixture of pre-shredded components and liquid is fed in at the center of the milling discs.

7. The method according to claim 6, wherein the mixture of pre-shredded components and liquid is fed in mechanically with a screw conveyor.

8. The method according to claim 6, wherein the mixture of pre-shredded components and liquid is fed in hydraulically with a carrier medium.

9. The method according to claim 1, wherein the metals are removed from the mixture with a wet separation table after the step of wet milling (5).

10. The method according to claim 9, wherein the liquid is water and the water is used in both of the wet milling of step (5) and as carrier material for the wet separation table.

11. The method according to claim 1, wherein any iron metal components, if present in the components, are removed with magnets after pre-shredding and before wet milling (5).

12. The method according to claim 1, wherein the components are pre-shredded to a size smaller than 20 mm;

iron metal components, if present in the components, are removed with magnets after pre-shredding and before wet milling (5);

the wet milling (5) takes place between two milling discs, at least one of which rotates;

a milling gap is present between the two milling discs and the milling gap is smaller than 1 mm;

the mixture of pre-shredded components and liquid is fed in at the center of the milling discs; and the metals are removed from the mixture with a wet separation table after wet milling (5).

13. The method according to claim 12, wherein the liquid is water and the water is used in both of the wet milling of step (5) and as carrier material for the wet separation table.

14. The method according to claim 1, wherein the liquid (20) is water.

* * * * *